United States Patent
Wakabayashi (10) Patent No.: US 10,410,866 B2
(45) Date of Patent: Sep. 10, 2019

(54) LASER ANNEALING METHOD AND LASER ANNEALING DEVICE

(71) Applicant: SUMITOMO HEAVY INDUSTRIES, LTD., Tokyo (JP)

(72) Inventor: Naoki Wakabayashi, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 7 days.

(21) Appl. No.: 15/927,322

(22) Filed: Mar. 21, 2018

(65) Prior Publication Data
US 2018/0277372 A1   Sep. 27, 2018

(30) Foreign Application Priority Data
Mar. 24, 2017   (JP) .................. 2017-058337

(51) Int. Cl.
| | |
|---|---|
| *H01L 21/268* | (2006.01) |
| *H01L 21/04* | (2006.01) |
| *B23K 26/064* | (2014.01) |
| *C30B 33/02* | (2006.01) |
| *H01L 21/20* | (2006.01) |
| *H01L 21/265* | (2006.01) |
| *H01L 21/324* | (2006.01) |
| *H01L 29/66* | (2006.01) |
| *H01L 29/16* | (2006.01) |
| *B23K 26/352* | (2014.01) |

(52) U.S. Cl.
CPC .......... *H01L 21/268* (2013.01); *B23K 26/064* (2015.10); *C30B 33/02* (2013.01); *H01L 21/046* (2013.01); *H01L 21/2026* (2013.01); *H01L 21/265* (2013.01); *H01L 21/324* (2013.01); *B23K 26/352* (2015.10); *H01L 29/1608* (2013.01); *H01L 29/66333* (2013.01)

(58) Field of Classification Search
CPC combination set(s) only.
See application file for complete search history.

(56) References Cited

FOREIGN PATENT DOCUMENTS

JP   2014-146757 A   8/2014

*Primary Examiner* — Ratisha Mehta
(74) *Attorney, Agent, or Firm* — Michael Best & Friedrich LLP (57) ABSTRACT

An annealing object is prepared in which an absorbing film formed of a metal is formed on a surface of a wafer formed of silicon carbide into which an unactivated dopant is implanted. The dopant is activated by causing a laser beam to be incident into the absorbing film. A power density of the laser beam in a surface of the annealing object is a value with which a silicide reaction is caused to occur between the absorbing film and the wafer and a metal silicide film formed by the silicide reaction is evaporated.

10 Claims, 5 Drawing Sheets

LASER ANNEALING METHOD AND LASER ANNEALING DEVICE

RELATED APPLICATIONS

Priority is claimed to Japanese Patent Application No. 2017-058337, filed Mar. 24, 2017, the entire content of which is incorporated herein by reference.

BACKGROUND

Technical Field

Certain embodiments of the present invention relate to a laser annealing method and a laser annealing device.

Description of Related Art

P-type conductivity is imparted to silicon carbide (SiC) by forming a carbon film on a SiC wafer into which aluminum as a p-type dopant is ion-implanted and performing a heat treatment on the carbon film in an induction heating furnace. In a case where power input to the induction heating furnace increases, the heat treatment temperature can increase. However, since it is necessary to heat the entire furnace, unnecessary energy is required to heat a portion other than the SiC wafer, for example, a susceptor. In addition, after annealing, a long period of time is required to cool the SiC wafer to room temperature. Further, a material forming the furnace is consumed in the high-temperature heat treatment.

In order to solve the problems, the related art discloses laser annealing as a method of heating a SiC wafer. In this laser annealing method, laser annealing is performed after forming a laser absorbing film (carbon film) on a surface of an ion implanted layer of a SiC wafer. By the laser absorbing film absorbing a laser beam having a wavelength that cannot be absorbed by SiC, the SiC wafer can be heated.

SUMMARY

According to an embodiment of the present invention, there is provided a laser annealing method including:

a step of preparing an annealing object in which an absorbing film formed of a metal is formed on a surface of a wafer formed of silicon carbide into which an unactivated dopant is implanted; and a step of activating the dopant by causing a laser beam to be incident into the absorbing film.

In the laser annealing method, a power density of the laser beam in a surface of the annealing object is a value with which a silicide reaction is caused to occur between the absorbing film and the wafer and a metal silicide film formed by the silicide reaction is evaporated.

According to another aspect of the present invention, there is provided a laser annealing device including:

a holding mechanism that holds an annealing object in which an absorbing film is formed on a surface of a wafer formed of silicon carbide into which an unactivated dopant is implanted;

a laser source that causes a laser beam to be incident into the annealing object held by the holding mechanism; and a control device that controls the laser source such that a power density of the laser beam in a surface of the annealing object is a value with which a silicide reaction is caused to occur between the absorbing film and the wafer and a metal silicide film formed by the silicide reaction is evaporated.

During a period during which a silicide reaction is caused to occur and a metal silicide film formed by the silicide reaction is evaporated, a wafer can be heated. The heated wafer is likely to absorb laser energy. Therefore, the wafer can be heated to a sufficient temperature for activating a dopant.

DETAILED DESCRIPTION

It was found that, with the laser annealing method of the related art, it is difficult to sufficiently activate a dopant implanted into a SiC wafer. It is desirable to provide a laser annealing method and a laser annealing device capable of activating a dopant implanted into a SiC wafer.

A laser annealing method according to an embodiment will be described with reference to FIGS. 1A to 1D. FIGS. 1A to 1D are cross-sectional views showing a SiC wafer before laser annealing and a SiC wafer during laser annealing.

Figure 1A:
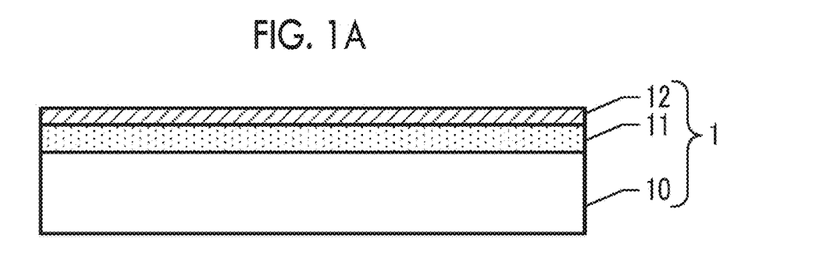
FIGS. 1A to 1D are cross-sectional views showing a SiC wafer before laser annealing and a SiC wafer during laser annealing.

As shown FIG. 1A, an annealing object 1 is prepared, the annealing object 1 including: a SiC wafer 10 that includes a surface layer on which a dopant implanted layer 11 is formed; and an absorbing film 12 that is formed on a surface of the SiC wafer 10. The SiC wafer 10 has n-type conductivity, and a dopant for imparting p-type conductivity, for example, aluminum (Al) is implanted into the dopant implanted layer 11. The absorbing film 12 can be formed of a metal that has a higher melting point than that of single-crystal silicon and forms a silicide with silicon, for example, tungsten (W), molybdenum (Mo), titanium (Ti), or niobium (Nb).

Figure 1B:
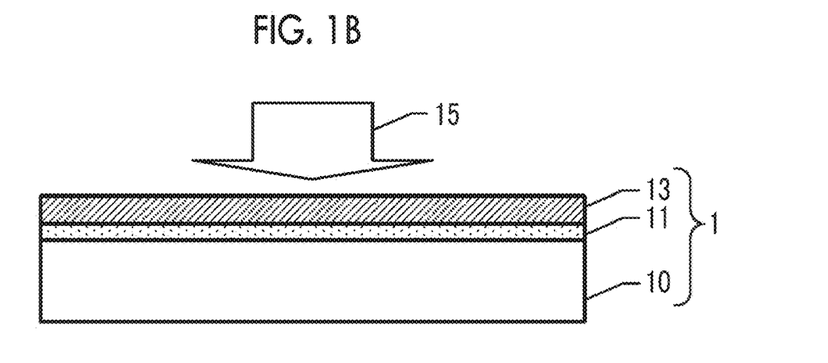

As shown in FIG. 1B, a laser beam 15 is caused to be incident into the absorbing film 12 (FIG. 1A) on the SiC wafer 10. As a result, a silicide reaction occurs, and a metal silicide film 13 is formed. The absorbing film 12 substantially disappears due to the silicide reaction. During the silicide reaction, the dopant implanted layer 11 of the SiC wafer 10 is heated.

Figure 1C:
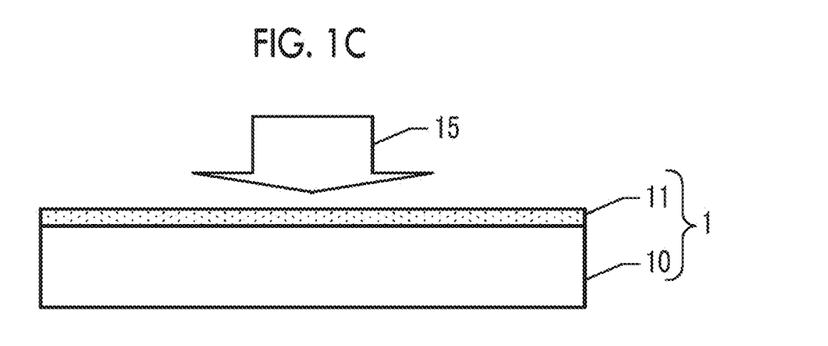

By continuing the incidence of the laser beam 15 as shown in FIG. 1C, the metal silicide film 13 (FIG. 1B) is evaporated. At this time, the dopant implanted layer 11 of the SiC wafer 10 is further heated.

Figure 1D:
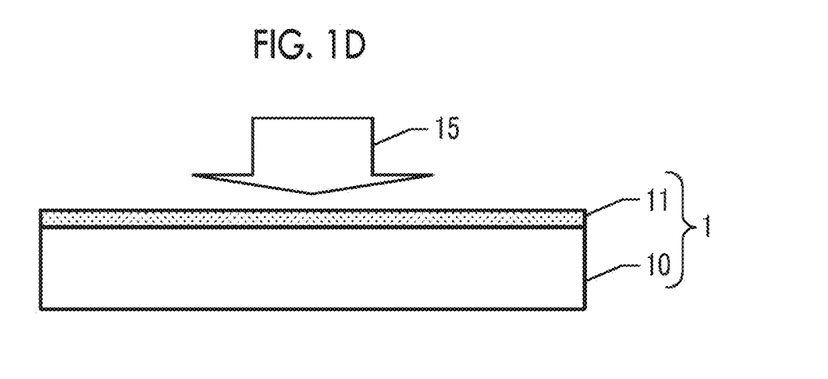

By further continuing the incidence of the laser beam 15 as shown in FIG. 1D, the dopant implanted layer 11 is further heated. As a result, the dopant in the dopant implanted layer 11 is activated.

Next, a laser annealing device according to the embodiment will be described with reference to FIG. 2.

Figure 2:
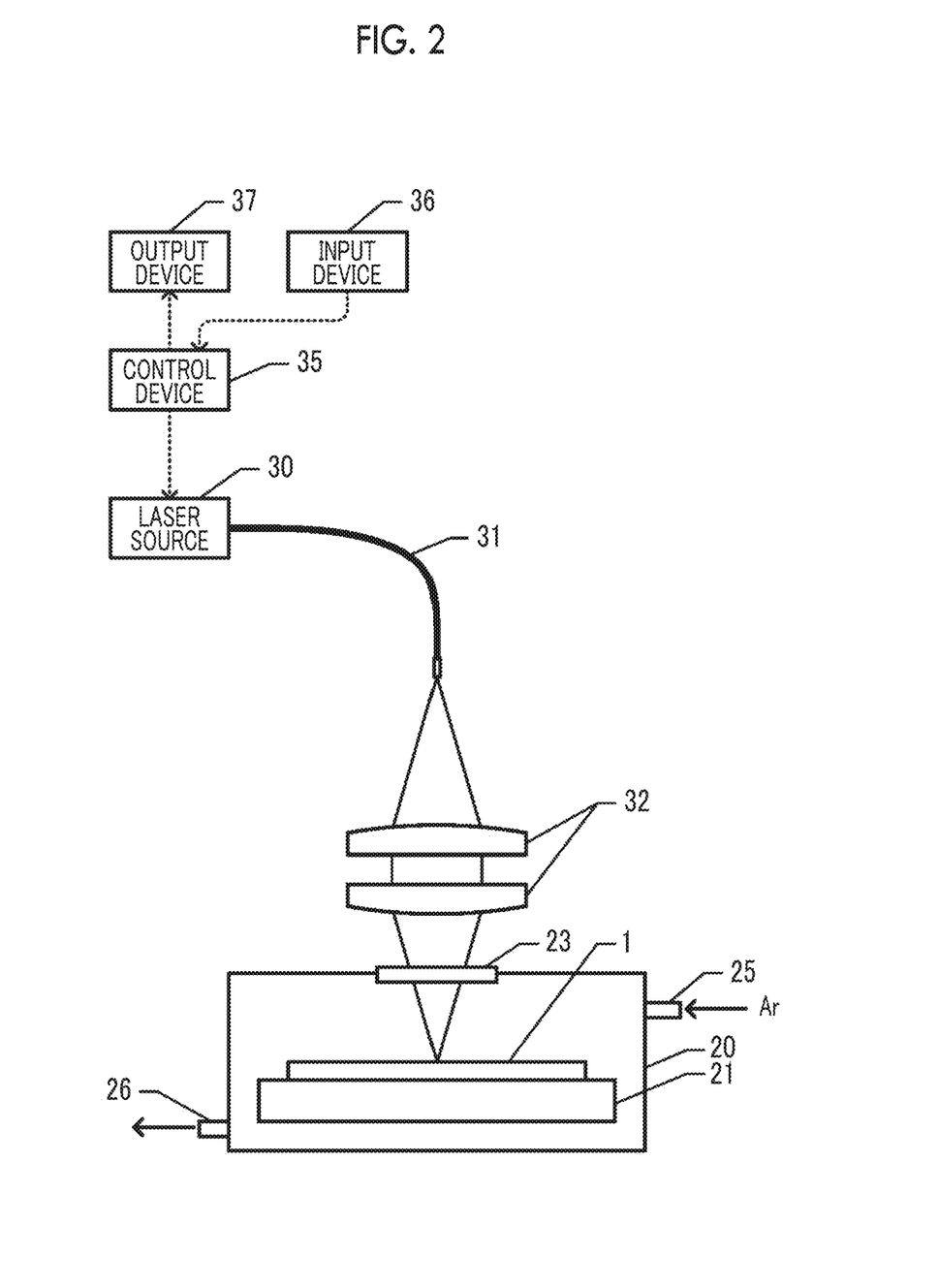
FIG. 2 is a schematic view showing a laser annealing device according to an embodiment.

FIG. 2 is a schematic view showing the laser annealing device according to the embodiment. A chamber 20 accommodates a holding mechanism 21. The holding mechanism 21 holds the annealing object 1 (FIGS. 1A to 1D). Inert gas, for example, argon (Ar) is introduced into the chamber 20 through a gas introduction port 25. The gas in the chamber 20 is exhausted through a gas exhaust port 26. A laser introduction window 23 is attached to a wall of the chamber 20. A laser beam introduced into the chamber 20 through the laser introduction window 23 is incident into the annealing object 1.

The laser source 30 outputs a laser beam for annealing. As the laser source 30, for example, a laser diode that outputs a laser beam having a wavelength of 800 nm can be used. The laser beam output from the laser source 30 is introduced into an optical fiber 31 and is output from an output end of the optical fiber 31. A maximum value of a power of the laser beam in the output end of the optical fiber 31 is, for example, 60 W. The laser beam output from the output end of the optical fiber 31 is collected by a light collection optical system 32, passes through the laser introduction window 23, and is incident into the annealing object 1 in the chamber 20.

In the output end of the optical fiber 31, a beam profile in a beam cross-section of the laser beam is made to be substantially uniform. Therefore, a profile of a beam spot of the laser beam in the surface of the annealing object 1 is also made to be substantially uniform. By changing the magnification of the light collection optical system 32, the size of the beam spot in the surface of the annealing object 1 can be changed. By changing the size of the beam spot, the power density of the laser beam can be changed. In addition, by changing the output of the laser source 30, the power density in the surface of the annealing object 1 can be changed.

A control device 35 controls the laser source 30. By an operator operating the input device 36, various commands, laser annealing conditions, and the like are input to the control device 35. The control device 35 outputs various information that should be notified to the operator from an output device 37.

[Heat Treatment Temperature] Next, a heat treatment temperature required to activate the dopant in SiC will be described.

During laser annealing, by setting similar annealing conditions to a heat treatment temperature and a heat treatment time during annealing of the related art using an induction heating furnace, the dopant can be activated to a similar degree to that of the related art. In this case, in order to utilize local heating that is a characteristic of laser annealing, it is preferable that the heat treatment temperature is high and the heat treatment time is short.

During annealing of the related art using an induction heating furnace, the heat treatment temperature is in a range of 1600° C. to 1800° C., and the heat treatment time is in a range of 5 minutes to 30 minutes. In order to reduce the heat treatment time during laser annealing to be shorter than the above-described range, it is necessary to further increase the heat treatment temperature. Since laser annealing is performed at a high temperature, it is preferable that the atmosphere in the chamber 20 (FIG. 2) is an inert gas atmosphere such as an Ar atmosphere.

[Diffusion Length] Next, a diffusion length required to activate the dopant in SiC will be described.

In order to activate the ion-implanted dopant, for example, Al, it is necessary to move (diffuse) the dopant to a position of a crystal lattice. At this time, the diffusion length L can be expressed by the following expression using a heat treatment temperature T and a heat treatment time t.

$$L=\sqrt{D(T)t} \qquad (1)$$

In the expression, $D(T)$ is defined by the following expression.

$$D(T) = D_0 \exp\left(-\frac{E_A}{kT}\right) \qquad (2)$$

$D_0$ represents a diffusion coefficient, $E_A$ represents an activation energy, and k represents a Boltzmann's constant. The diffusion coefficient $D_0$ of Al in SiC is $1.3 \times 10^{-8}$ m²/s, and the activation energy $E_A$ is 2.394 eV.

In the ranges of the annealing conditions of the related art using an induction heating furnace, the lower limit value of the heat treatment temperature is 1600° C., and the lower limit value of the heat treatment time is 5 minutes. At this time, the diffusion length L is 13.6 nm. In the ranges of the annealing conditions of the related art using an induction heating furnace, the upper limit value of the heat treatment temperature is 1800° C., and the upper limit value of the heat treatment time is 30 minutes. At this time, the diffusion length L is 67.5 nm. In four-fold periodicity hexagonal silicon carbide (4H—SiC), a lattice spacing in an a-axis direction is 0.3 nm, and a lattice spacing in a c-axis direction is 1.0 nm. It can be seen that, in order to activate the dopant in SiC, annealing should be performed under conditions where the diffusion length is ten times or more the lattice spacing.

[Direct Heating of SiC using Laser] Next, a method of directly heating the SiC wafer by laser irradiation in order to activate the dopant in SiC will be discussed with reference to FIG. 3.

Figure 3:
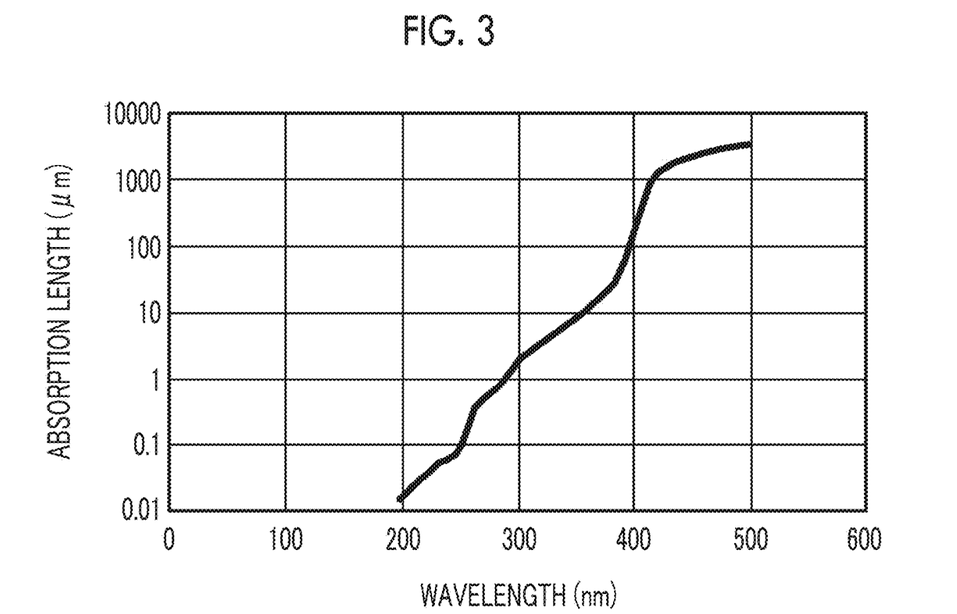
FIG. 3 is a graph showing wavelength dependence of an absorption length (the inverse of an absorption coefficient) of SiC.

FIG. 3 is a graph showing wavelength dependence of an absorption length (the inverse of an absorption coefficient) of SiC. The horizontal axis represents the wavelength in units of "nm", and the vertical axis represents the absorption length in units of "µm". At a wavelength of 350 nm, the absorption length is about 10 µm. As the wavelength of the laser beam is longer than 350 nm, the dopant implanted layer 11 of the SiC wafer does not substantially absorb laser energy. Accordingly, in order to directly heat the SiC wafer to activate the dopant, it is preferable to use a laser beam having a wavelength of shorter than 350 nm.

Incidentally, a laser source capable of obtaining high power in an ultraviolet range shorter than a wavelength of 350 nm is basically a pulse oscillator, and a pulse width thereof is in a range of 1 ns to 100 ns. In a case where laser annealing is performed for a heating time of 100 ns that is longest pulse width in the above-described range, even at a heat treatment temperature of 2545° C. that is a sublimation temperature of SiC, the diffusion length L is shorter than a diffusion length required for activation by about four digits. In order to compensate for the difference of four digits, it is necessary to irradiate 10000 shots or more of pulse laser beams. Accordingly, the method of directly heating SiC using a pulse laser beam in the ultraviolet range to activate the dopant is not realistic.

[Combination of Preheating of SiC] Next, a method of preheating the SiC wafer during laser annealing will be discussed. As the temperature of the SiC wafer increases, lattice vibration increases, and there is an effect on a covalent bond that binds respective atoms of SiC. As a result, even light having a lower photon energy than an energy band gap during room temperature is absorbed by SiC. The energy band gap of 4H—SiC crystals at room temperature is 3.26 eV. It can be seen that a certain level of preheating is required in order to make the 4H—SiC crystals absorb general green light (photon energy: about 2.3 eV) or light (photon energy: about 1.5 eV) in a near-infrared range. Therefore, a heating device for preheating the SiC wafer to a high temperature is required, and thus the configuration of the annealing device is largely limited.

This way, the method of preheating the SiC wafer before laser irradiation to make the SiC wafer directly absorb the laser energy is not realistic.

[Absorbing Film Absorbing Laser] It can be seen that the method of directly heating the SiC wafer by laser irradiation to activate the dopant and the method of directly heating the SiC wafer in combination with preheating are not realistic. Examples of another method of activation annealing include a method of indirectly heating the dopant implanted layer 11 by forming the absorbing film 12 (FIG. 1A) that absorbs laser energy on the SiC wafer 10 and heating the absorbing film 12 by laser irradiation.

As a material of the absorbing film 12, a material that has no adverse effect on electrical characteristics of SiC when incorporated into SiC is preferably used. For example, Al used as the dopant is preferably used as the material of the absorbing film. However, Al has a high reflectance with respect to a laser beam and thus is not suitable for the absorbing film. Further, since Al has a low melting point, the heat treatment temperature during laser annealing is necessarily low. Therefore, Al is not suitable for the absorbing film used for short period of heating such as laser annealing.

As other examples of the material of the absorbing film, for example, Ti, Mo, W, Nb, or Cr that can be used as an ohmic electrode with respect to SiC and has a high melting point can be used. This metal can be used as a material forming a silicide layer. Even in a case where a part of the metal forming the absorbing film is incorporated into the SiC wafer, there is little adverse effect during a heat treatment, and a countermeasure can be easily taken. Among the examples, for example, W, Mo, Ti, or Nb can be used as a metal having a low reflectance with respect to a laser beam. In a case where the absorbing film is formed on a surface of the SiC wafer using this metal and then laser annealing is performed, the metal reacts with Si to form a silicide layer. The metal also reacts with C that remains after the silicide reaction to form a compound. Therefore, an effect of suppressing flotation of C alone after the silicide reaction can be obtained.

[Advantageous Effect of Embodiment] Next, an advantageous effect of the embodiment will be described with reference to FIG. 4.

In the embodiment, the annealing object 1 (FIG. 1A) includes the absorbing film 12. The absorbing film 12 has a higher absorption coefficient than the SiC wafer 10 with respect to light in a wavelength range of a laser beam used for laser annealing, for example, light in a wavelength range of 800 nm. Therefore, the absorbing film 12 can efficiently absorb laser energy.

Since the metal film is used as the absorbing film 12, an effect of suppressing breakage of the SiC wafer 10 during laser irradiation can be obtained.

During irradiation of the laser beam 15 (FIG. 1B), a silicide reaction occurs between the absorbing film 12 (FIG. 1A) and Si of the SiC wafer 10. As a result, the metal silicide film 13 (FIG. 1B) that is an inter metallic compound of an element forming the absorbing film 12 and Si is formed. Si atoms in the SiC wafer 10 are consumed to form the metal silicide film 13. Therefore, the number of Si atoms is insufficient in the vicinity of the metal silicide film 13, and the metal silicide film 13 is rich in C. In a case where the number of Si atoms is insufficient, Al atoms as the dopant are likely to be introduced into lattice sites of Si atoms due to a site competition effect. As a result, an effect of promoting the activation of the dopant can be obtained.

In a case where the dopant is ion-implanted into the SiC wafer 10, the dopant ions that are accelerated to a high speed are implanted into the surface of the SiC wafer 10. In a case where the dopant ions enter into the SiC wafer 10, the dopant ions interact with a large number of atoms in the SiC wafer 10 to be decelerated. In a case where the speed decreases, the dopant ions collide with Si atoms or C atoms in the SiC wafer 10. As a result, the dopant ions can be implanted into a region of a depth range of the SiC wafer 10. In the vicinity of a depth at which the concentration of the dopant ions reaches a peak, crystal defects increase, and crystallinity deteriorates.

In the very vicinity of the surface of the SiC wafer 10, the energy of the dopant ions is excessively high. Therefore, the collision cross-section is small, and the dopant ions are less likely to collide with Si atoms or C atoms. Therefore, in the very vicinity of the surface of the SiC wafer 10, crystal defects or strains caused by ion implantation are extremely small.

Figure 4A:
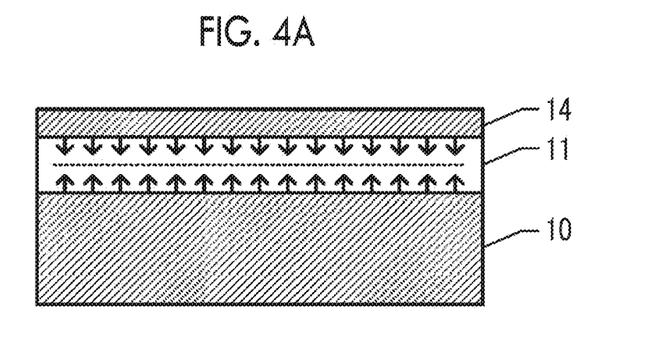
FIG. 4A is a schematic cross-sectional view showing the SiC wafer into which dopant ions are implanted.

FIG. 4A is a schematic cross-sectional view showing the SiC wafer 10 into which the dopant ions are implanted. The crystal defect density in an outermost surface layer 14 that is shallower than the dopant implanted layer 11 is lower than that in the dopant implanted layer 11 in which the crystallinity deteriorates. In a case where activation annealing is performed in this state, the crystallinity of the dopant implanted layer 11 having low crystallinity is recovered from highly crystalline upper and lower regions to the inside of the dopant implanted layer 11. Crystal growth have specificity in growth direction. Therefore, in a case where crystal grow from upper and lower interfaces to the inside such that the crystallinity is recovered, the crystals that grow from the upper and lower regions are not crystallographically connected to each other at an interface where they are in contact with each other. That is, a large amount of crystal defects remain at the interface between the crystals that grow upward from the lower region and the crystals that grow downward from the upper region.

In the embodiment, the metal silicide film 13 (FIG. 1B) is formed on a region corresponding to the outermost surface layer 14 shown in FIG. 4A. The metal silicide film 13 is evaporated in a step shown in FIG. 1C.

Figure 4B:
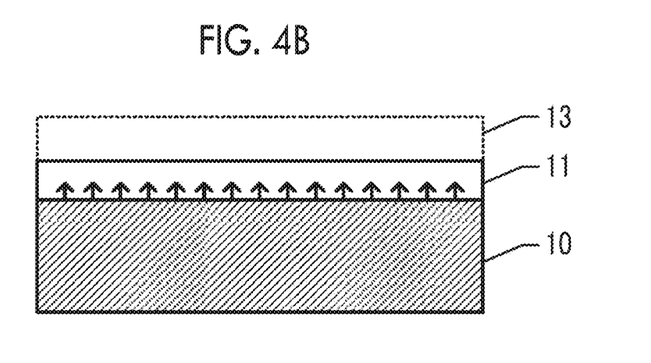
FIG. 4B is a schematic cross-sectional view showing the SiC wafer in which a metal silicide film is evaporated.

FIG. 4B is a schematic cross-sectional view showing the SiC wafer 10 in which the metal silicide film 13 is evaporated. In the embodiment, since the metal silicide film 13 is evaporated, crystals do not grow downward from the upper region of the dopant implanted layer 11. Therefore, an increase in crystal defects can be suppressed in the dopant implanted layer 11 where the crystallinity is recovered after activation annealing. Further, the crystal growth direction or the crystallinity recovery direction can be limited to one direction. Therefore, activation can be performed under conditions where a thermal load is low.

Since SiC cannot be maintained in the liquid phase under the atmospheric pressure, it is important to process the highly crystalline outermost surface layer 14 (FIG. 4A). For example, an increase in crystal defects can be suppressed, for example, using a method of performing the ion implantation with a low energy with which the highly crystalline outermost surface layer 14 is not formed or using a method of additionally performing a process of removing the outermost surface layer 14 after the ion implantation. In the embodiment, an increase in crystal defect can be suppressed without adopting the above-described method.

[Evaluation Experiment of Crystallinity Recovery by Laser Annealing] Next, the results of an evaluation experiment in which the activation of the dopant in the SiC wafer 10 was performed will be described with reference to FIGS. 5 and 6.

In the evaluation experiment, as the SiC wafer 10 of the annealing object 1, n-type 4H—SiC wafer having a surface layer on which an epitaxial film was formed was used. The configuration of the SiC wafer is as follows. Diameter: 100 mm
Thickness: 350 μm
Off angle: 4 degrees
Thickness of epitaxially grown film: 5 μm
N-type dopant concentration of epitaxial film: $1 \times 10^{15}$ $cm^{-3}$ or lower
Ion implantation conditions of the dopant are as follows.
Ion species: $Al^+$
Acceleration energy: 350 keV
Dose: $4 \times 10^{14}$ $cm^{-2}$
Wafer temperature during implantation: 500° C.

Figure 5:
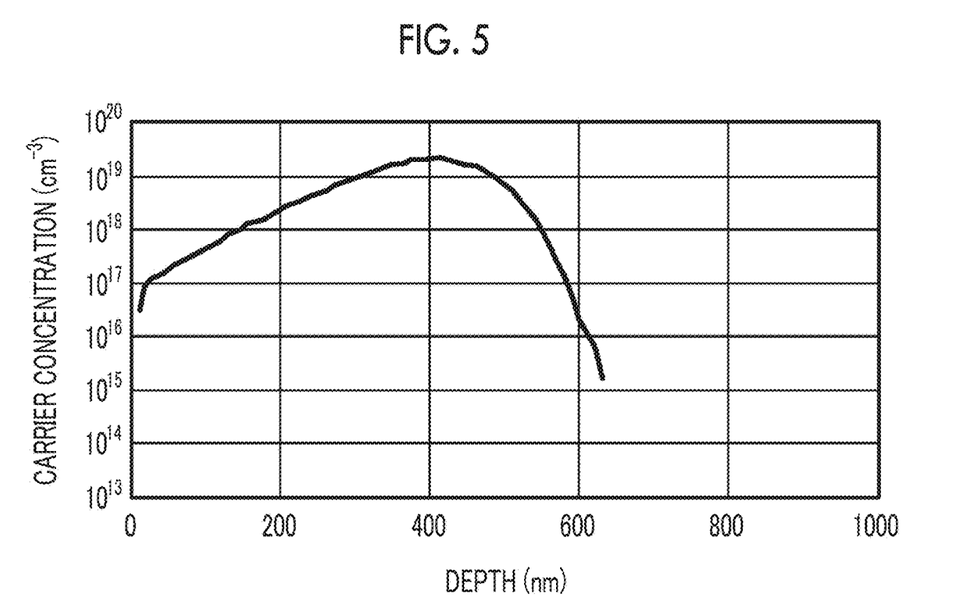
FIG. 5 is a graph showing a carrier concentration profile of the SiC wafer into which the dopant ions are implanted.

FIG. 5 is a graph showing a carrier concentration profile of the SiC wafer 10 into which the dopant ions are implanted under the above-described conditions. The horizontal axis represents the depth in units of "nm", and the vertical axis represents the carrier concentration in units of "$cm^{-3}$". The dose was set such that, at a depth of 400 nm, the carrier concentration shows a maximum value and a peak carrier concentration exceeds b $1 \times 10^{19}$ $cm^{-3}$.

Next, a method of evaluating activation annealing will be described. In order to evaluate activation, it is necessary to verify whether or not Al atoms as dopant atoms are substituted with Si atoms. However, in analysis of carrier concentration or polarity, only information regarding Al atoms substituted with Si atoms can be obtained. Therefore, the state of unactivated Al atoms cannot be presumed, and the analysis of carrier concentration or polarity is not suitable for evaluating the activation process. Accordingly, the activation process can be evaluated based on the degree of the recovery of crystal defects (the highness of crystallinity) formed by ion implantation.

In order to evaluate crystallinity, Raman spectroscopy was used. In a pure single crystal, atoms are periodically arranged. These atoms vibrate at a certain vibration level. In a case where the 4H—SiC wafer is irradiated with a laser beam having a lower photon energy than an energy band gap, electrons in a valence band absorb photon energy with a certain probability. The electrons that absorb a lower photon energy than an energy band gap are excited to a virtual level but return to the valence band immediately. The photon energy is not absorbed by the 4H—SiC crystals. Therefore, in a case where the electrons return to the ground state, photons having the same energy as that of the incident photons are emitted due to the law of conservation of energy.(this phenomenon is called "Rayleigh scattering").

However, the electrons may undergo transition to a higher energy level than that of the incident photons by the vibration level with a certain probability. The energy level corresponds to the vibration level. In a case where the electrons return to the ground state, photons having a lower photon energy than that of the incident photons by an energy corresponding to the vibration level are emitted due to the law of conservation of energy. This phenomenon is called Stokes Raman scattering. A change in wavelength derived from the photon energy is called Raman shift.

In the 4H—SiC crystals, peaks of the scattering light intensity derived from Raman shift appear at positions of 775 $cm^{-1}$ and 797 $cm^{-1}$. In this evaluation experiment, the signal intensity that appears at a position of 797 $cm^{-1}$ was lower. Therefore, the crystallinity of the 4H—SiC crystals was evaluated based on the signal intensity that appears at a position of 775 $cm^{-2}$.

In a single crystal having low crystallinity, the periodicity of atomic arrangement is low, and thus the purity of a vibration level is low. As the crystallinity of 4H—SiC crystals becomes lower, a vibration level other than the energy corresponding to 775 $cm^{-1}$ increases, and thus the signal intensity at a position of 775 $cm^{-1}$ decreases. By measuring the signal intensity at a position of 775 $cm^{-1}$ by Raman spectroscopy using this phenomenon, the crystallinity can be evaluated.

Figure 6:
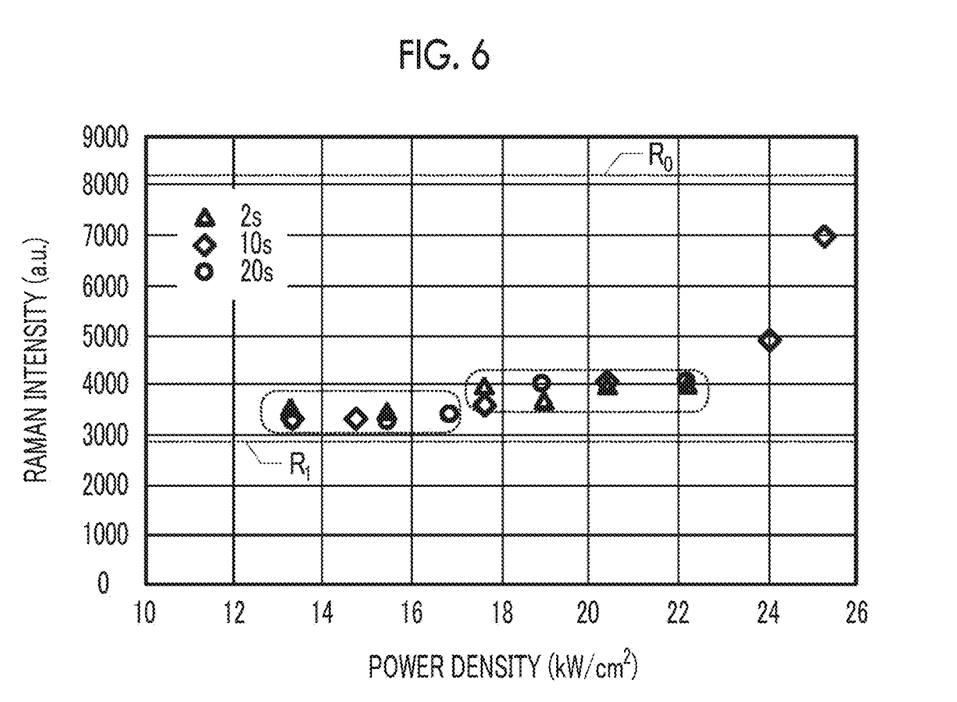
FIG. 6 is a graph showing a relationship between a power density of the laser beam (FIGS. 1B to 1D) in a surface of the SiC wafer and a signal intensity at a position of 775 $cm^{-1}$ obtained by Raman spectroscopy, the laser beam irradiating the SiC wafer on which an absorbing film is formed.

FIG. 6 is a graph showing a relationship between the power density of the laser beam 15 (FIGS. 1B to 1D) in the surface of the annealing object 1 and the signal intensity (hereinafter, also referred to as "Raman intensity") at a position of 775 $cm^{-1}$, the laser beam 15 irradiating the annealing object 1 on which the absorbing film 12 is formed. The horizontal axis represents the power density of the laser beam 15 in the surface of the annealing object 1 in units of "$kW/cm^2$", and the vertical axis represents the Raman intensity in arbitrary units. In the graph of FIG. 6, the symbols triangles, rhombuses, and circles represent the measurement results of cases where the laser irradiation times were set as 2 seconds, 10 seconds, and 20 seconds, respectively. As the absorbing film 12, a W film having a thickness of 100 nm was used.

A Raman intensity $R_0$ of a bare wafer before ion implantation was 8200 counts. This Raman intensity $R_0$ is a desired value of the Raman intensity of the SiC wafer 10 in which crystals are recovered by laser annealing. A Raman intensity $R_1$ of the SiC wafer 10 before laser annealing and after ion implantation of Al was 2900 counts.

In a case where the power density is in a range of 17 $kW/cm^2$ or lower, the Raman intensity remains at a substantially fixed value even after increasing the power density. The degree of recovery of crystallinity is determined by the heat treatment temperature and the heat treatment time. In the evaluation experiment, the heat treatment time was set as 2 seconds, 10 seconds, or 20 seconds. Since the diffusion coefficient D depends on the heat treatment temperature, the diffusion length should increase as the heat treatment temperature increases. The reason why the recovery of crystallinity does not progress in a power density range of 17 $kW/cm^2$ or lower is presumed to be that the heat treatment temperature is not increased.

It can be seen that the Raman intensity increased stepwise with a power density of 17 $kW/cm^2$. However, in a case where the power density is in a range of 17 $kW/cm^2$ to 23 $kW/cm^2$, the Raman intensity remains at a substantially fixed value, and the crystallinity is not recovered. The reason for this is also presumed to be that the heat treatment temperature is not sufficiently increased.

In the evaluation experiment, in a case where the power density was higher than 17 $kW/cm^2$, the absorbing film 12 formed of W caused a silicide reaction to occur, and the metal silicide film 13 (FIG. 1B) was formed. The reason for this is presumed to be as follows. Under a condition where the power density is 17 kW/cm² or lower, the laser energy absorbed by the absorbing film 12 is consumed as latent heat required for the silicide reaction between W and Si. Therefore, an increase in the temperature of the SiC wafer 10 is suppressed. Therefore, in a case where the power density is in a range of 17 kW/cm² or lower, the Raman intensity remains at a substantially fixed value even after increasing the power density of the heat treatment time, and the crystallinity is not substantially recovered.

In a case where the power density is 23 kW/cm² or higher, the metal silicide film 13 (FIG. 1B) starts to be evaporated. In a case where the power density is in a range of 17 kW/cm² to 23 kW/cm², the laser energy input to the metal silicide film 13 is consumed as latent heat of evaporation of the metal silicide film 13. Therefore, it is presumed that, even in a case where the power density is increased in a range of 17 kW/cm² to 23 kW/cm², the temperature of the SiC wafer 10 is not sufficiently increased.

During a period during which the metal silicide film 13 is evaporated and removed (during a period from FIG. 1B to FIG. 1C), the dopant implanted layer 11 is heated such that the temperature increases. For example, it is presumed that the temperature of an interface between the metal silicide film 13 and the dopant implanted layer 11 is increased to about a boiling point of tungsten silicide.

In a case where the power density is 23 kW/cm² or higher, the dopant implanted layer 11 is irradiated with laser even after the metal silicide film 13 is evaporated (FIG. 1D). At the time when the metal silicide film 13 is evaporated, the temperature of the dopant implanted layer 11 is preheated to a sufficiently high temperature. Therefore, the dopant implanted layer 11 can absorb the laser energy. Therefore, even after the absorbing film 12 and the metal silicide film 13 are removed, the dopant implanted layer 11 absorbs the laser energy and is further heated to a high temperature. As a result, in a power density range of 24 kW/cm² or higher, the Raman intensity increases as the power density increases. That is, the crystallinity is recovered.

In a power density range of 23 kW/cm² or lower, that is, in a power density range where the dopant implanted layer 11 is not heated to a sufficient temperature for recovering the crystallinity, the Raman intensity does not substantially change even after changing the heat treatment time in a range of 2 seconds to 20 seconds. It is presumed that, in a power density range of 24 kW/cm² or higher, the recovery of crystallinity actually progresses, and thus the Raman intensity increases as the heat treatment time increases.

As described above, by evaporating the metal silicide film 13 formed on the surface of the SiC wafer 10 and then further continuing laser irradiation, the crystallinity of the dopant implanted layer 11 can be recovered.

[Evaluation Experiment of Activation by Laser Annealing] A sample on which laser annealing was performed under a condition where the crystallinity was able to be recovered was evaluated for the degree of activation of the dopant. Hereinafter, the results will be described with reference to FIG. 7. In the evaluation experiment, regarding the annealing object 1 into which Al was ion-implanted, laser annealing was performed with a power density of 26.2 kW/cm² for 10 seconds.

Figure 7:
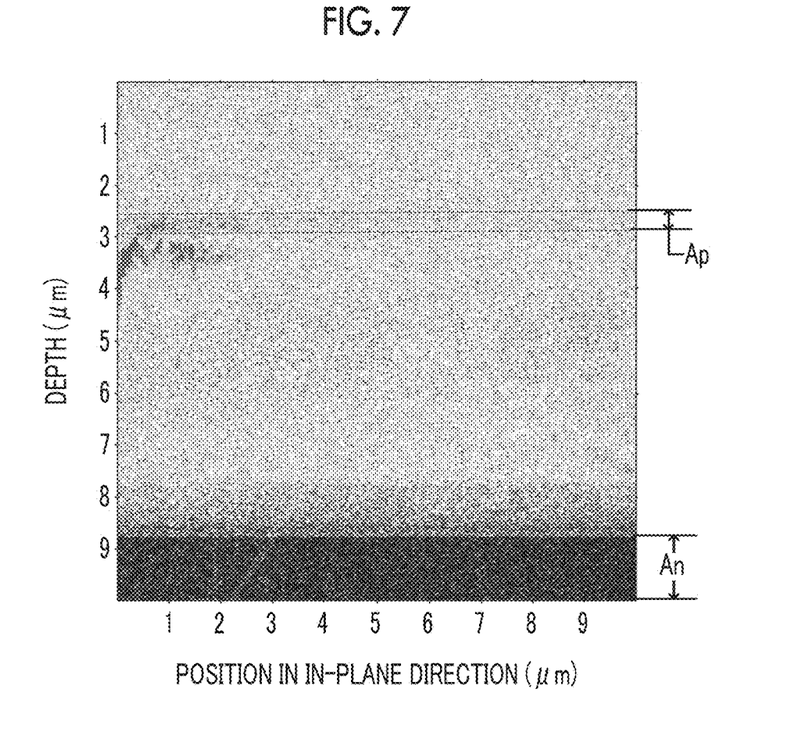
FIG. 7 is a diagram showing an SCM image of a cross-section of the SiC wafer after laser annealing.

FIG. 7 is a diagram showing an SCM image of a cross-section of the SiC wafer 10 after laser annealing. The horizontal axis represents the position of the SiC wafer 10 in an in-plane direction in units of "μm", and the vertical axis represents the position of the SiC wafer in a depth direction in units of "μm". The SCM image was obtained by scanning capacitance microscopy. The resolution threshold of a scanning capacitance microscope used was about $1\times10^{15}$ cm⁻³. A dark region An that appears at a position deeper than a depth of 9 μm of FIG. 7 corresponds to the n-type SiC wafer. A region that is shallower than the region An corresponds to the epitaxial layer. A slightly dark region Ap that appears at a position slightly shallower than a depth of 3 μm corresponds to the dopant implanted layer 11. In a case where the region Ap was measured by scanning capacitance microscopy, it was found that the region Ap has p-type conductivity. The conductivities of the other regions was not able to be determined. The reason for this is that the n-type dopant concentration of the epitaxial layer was $1\times10^{15}$ cm⁻³ or lower which was substantially equal to the resolution threshold of the scanning capacitance microscope. Actually, the n-type region An is represented by a large number of blue dots, and the p-type region Ap is represented by a large number of orange dots. In a region in which conductivity cannot be determined, blue dots and orange dots are present together.

Next, the activation rate of the dopant will be discussed. The carrier concentration can be determined by scanning capacitance microscopy. Therefore, the activation rate is measured based on the sensitivity of the scanning capacitance microscope, the dopant profile shown in FIG. 5, and the thickness of the p-type region Ap shown in FIG. 7.

The initial n-type carrier concentration in the epitaxial layer is $1\times10^{15}$ cm⁻³ at a maximum. In the p-type region Ap, the conductivity type is inverted from n-type to p-type by the activation of the dopant. It can be seen from the sensitivity of the scanning capacitance microscope that the p-type carrier concentration in the p-type region Ap is $1\times10^{15}$ cm⁻³ or higher. Accordingly, it is presumed that the concentration of the activated dopant is $2\times10^{15}$ cm⁻³ or higher.

In addition, it can be seen from FIG. 7 that the thickness of the p-type region Ap is about 0.4 μm. It can be seen from the dopant profile shown in FIG. 5 that, in a case where the conductivity type of a region having a dopant concentration of $1\times10^{18}$ cm⁻³ or higher is inverted to p-type, the thickness of the p-type region is about 0.4 μm. The concentration of the implanted dopant is in a range of $1\times10^{18}$ cm⁻³ or higher, and the concentration of the activated dopant is $2\times10^{15}$ cm⁻³ or higher. Therefore, it is presumed that the activation rate is about 0.2%.

During activation annealing of the related art using an induction heating furnace, the activation rate is about 1%. It is presumed that, as compared to the result of the related art, a sufficiently high activation rate can be obtained by performing laser annealing with a power density with which the degree of the recovery of crystallinity slightly exceeds a threshold.

The following points can be obtained from the above-described evaluation experiment.

By forming the absorbing film 12, which is formed of a metal for causing a silicide reaction to occur, on the surface of the SiC wafer 10, forming the metal silicide film 13, by laser annealing, and evaporating the metal silicide film 13, the SiC wafer 10 can be sufficiently preheated. By continuously irradiating the preheated SiC wafer 10 with laser, the dopant can be activated. In order to sufficiently obtain the preheating effect, it is preferable that the absorbing film is formed of a metal having a high melting point. For example, in a case where the absorbing film is formed of a metal having a lower melting point than that of single-crystal silicon, a silicide film is formed in a state where the SiC wafer 10 is not heated to a sufficient temperature, and thus it is difficult to sufficiently preheat the SiC wafer 10. In order to sufficiently preheat the SiC wafer 10 during the formation of the silicide film, it is preferable that a metal having a higher melting point than that of single-crystal silicon is used. Examples of the metal include tungsten, molybdenum, titanium, and niobium.

In order to evaporate the metal silicide film 13, it is necessary to set the power density of the laser beam to be a given threshold (first threshold) or higher. It can be seen from FIG. 6 that the first threshold is about 23 kW/cm$^2$. By causing a laser beam to be incident with a power density of the first threshold or higher, the crystallinity of the SiC wafer 10 can be recovered. In order to activate the dopant, it is preferable that laser annealing is performed with a power density of the first threshold or higher.

It can be seen from the results of the evaluation experiment shown in FIG. 7 that the power density is preferably 26 kW/cm$^2$ or higher in order to obtain a sufficient activation rate. Further, the irradiation time of the laser beam (the irradiation time of the laser beam on the same region of the surface of the SiC wafer 10) is preferably 1 second or longer, more preferably 2 seconds or longer, and 10 seconds or longer. By increasing the irradiation time of the laser beam, the activation rate can be increased.

In a case where activation annealing is performed using the laser annealing device shown in FIG. 2, the control device 35 may control the laser source 30 such that conditions for the activation are satisfied. As a first condition for the activation, for example, the power density of the laser beam in the surface of the annealing object 1 (FIG. 1B) is a value with which a silicide reaction can be caused to occur between the absorbing film 12 and the SiC wafer 10. As a second condition for the activation, for example, the power density of the laser beam in the surface of the annealing object 1 (FIG. 1B) is a value with which the metal silicide film 13 (FIG. 1B) formed by the silicide reaction can be evaporated.

In the evaluation experiment of the crystallinity recovery described above with reference to FIGS. 5 and 6, the thickness of the SiC wafer was 350 μm, and the thickness of the epitaxial film was 5 μm. In addition, in the evaluation experiment of the activation described above with reference to FIG. 7, the thickness of the SiC wafer was 375 μm.

Next, in a case where the thickness of the SiC wafer is not limited, a generally preferable range of the power density of the laser beam will be described.

In a case where an IGBT or the like is formed on a SiC wafer, a p-type layer is formed on a back surface of the wafer. In this case, in order to improve electrical characteristics, the wafer is ground to reduce the thickness. In addition, in a case where a p-type layer is formed on a front surface of the SiC epitaxial wafer, the thickness of the wafer may be larger than that of the wafer used in the evaluation experiment. In particular, the dielectric breakdown strength of SiC is about ten times that of Si. Therefore, from the viewpoint of electrical characteristics, the thickness of the SiC wafer can be set to be much smaller than that of a Si wafer.

Heat capacity that has a large effect on the heat treatment temperature during laser annealing depends on the thickness of the SiC wafer. Therefore, the power density required for the crystallinity recovery or the activation varies depending on the thickness of the SiC wafer. In addition, the size or shape of the wafer is also important. In a case where laser annealing is performed on a SiC wafer divided into chips, the heat capacity is lower than that of a non-divided SiC wafer, and thus the power density required for the crystallinity recovery or the activation decreases. In this case, the divided SiC chips are also called as "SiC wafer".

The power density is a value obtained by dividing the power of the laser beam in the wafer surface by the area of the beam spot, and is an important parameter for the crystallinity recovery and the activation of the dopant (for example, aluminum). Here, individual parameters will be separately discussed. Under a condition that the diameter and thickness of the wafer is fixed, the heat capacity of the annealing object is fixed. Therefore, as the power of the laser beam increases, that is, the heat input increases, the heat treatment temperature is likely to increase. Therefore, by increasing the power, the beam spot of the laser beam can also be increased. In a case where the beam spot increases, energy loss caused by thermal diffusion to the periphery is reduced, and thus the power density required for the activation decreases.

As a result, the optimum power density for the recovery of crystallinity or the activation of the dopant is affected by the thickness and shape of the SiC wafer and the specification of the laser annealing device. The evaluation experiment of FIG. 7 in which the dopant was activated with a power density of 26 kW/cm$^2$ or higher merely is exemplary. In a case where the thickness of the wafer is small or the power of the laser beam is large, the dopant can be activated with a lower power density.

Accordingly, it is expected that, in a case where the power of the laser beam, the thickness of the wafer, the size of the wafer, or the like is changed, the power density required for the activation of the dopant can be reduced to about half of 26 kW/cm$^2$ that is the power density required for the activation of the dopant in the evaluation experiment of FIG. 7. For example, it is expected that a preferable range of the power density is 13 kW/cm$^2$ or higher.

[Modification Example of Embodiment] In the embodiment, the laser diode having an oscillation wavelength of 800 nm is used as the laser source. However, a laser source having an oscillation wavelength in another wavelength range may be used. As the laser source, a laser oscillator having an oscillation wavelength in a wavelength range where a laser beam can be absorbed by the absorbing film 12 (FIG. 1A) is preferably used. In addition, in the embodiment, a continuously oscillating laser beam is used. However, a pulse laser beam having a power with which the metal silicide film 13 (FIG. 1B) can be evaporated may be used.

In order to increase the temperature of the SiC wafer 10 during laser annealing, a mechanism having a structure that inhibits heat transfer from the SiC wafer 10 to the outside of the mechanism may be used as the holding mechanism 21 (FIG. 2). For example, a pin holder-shaped structure that is in contact with a partial region of the bottom surface of the SiC wafer 10 and supports the SiC wafer 10 may be used. In addition, a structure that holds the vicinity of the outer periphery of the SiC wafer 10 and supports an inner portion thereof in the air may be used.

In the embodiment, the 4H—SiC wafer is used as the annealing object. However, a SiC wafer having another crystal structure, for example, 3C—SiC or 6H—SiC may be used as the annealing object. In addition, in the embodiment, Al is used as the p-type dopant. However, another dopant, for example, boron (B) may be used as the p-type dopant.

In the embodiment, the p-type dopant implanted into the SiC wafer is activated. However, an n-type dopant can also be activated using the laser annealing method of the embodiment. As the n-type dopant, for example, nitrogen (N) or phosphorus (P) can be used.

Next, a laser annealing device according to another embodiment will be described with reference to FIG. 8. Hereinafter, the common configurations to the laser annealing device shown in FIG. 2 will not be described.

Figure 8:
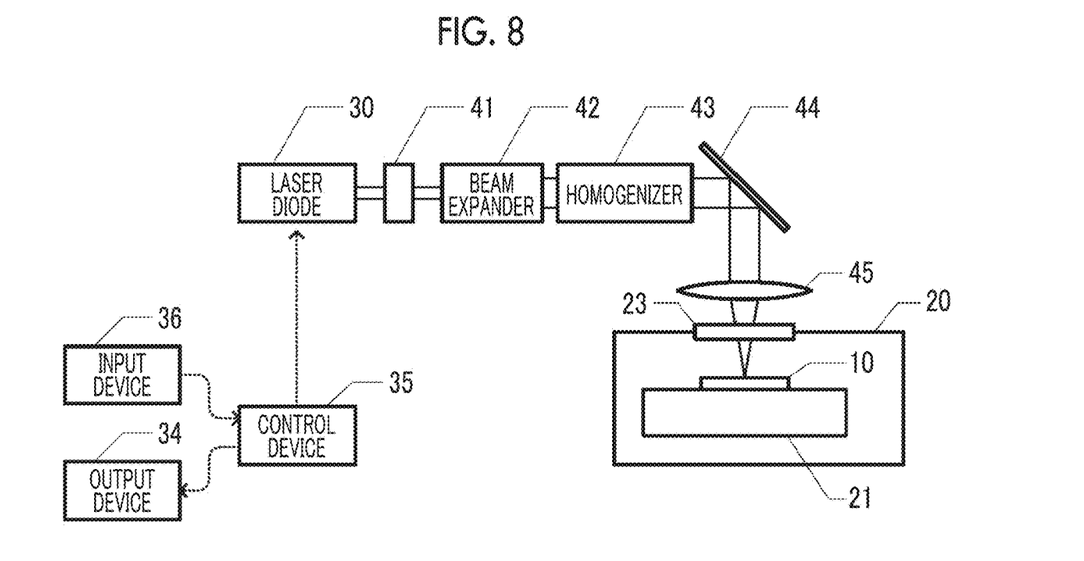
FIG. 8 is a schematic view showing a laser annealing device according to another embodiment.

FIG. 8 is a schematic view showing the laser annealing device according to the embodiment. In the laser annealing device according to the embodiment, an attenuator 41, a beam expander 42, a homogenizer 43, a bending mirror 44, and a light collection optical system 45 are used instead of the optical fiber 31 of the laser annealing device shown in FIG. 2.

The attenuator 41 attenuates the laser beam. The beam expander 42 collimates the incident laser beam and expands the beam diameter. The homogenizer 43 and the light collection optical system 45 adjusts a beam cross-section in the surface of the SiC wafer 10 to have a predetermined shape, and homogenizes a beam intensity distribution in the beam cross-section.

Even in a case where the laser annealing device shown in FIG. 8 is used, the activation of the dopant in the SiC wafer 10 can be performed as in the laser annealing device shown in FIG. 2.

The SiC wafer prepared using the method according to the embodiment shown in FIGS. 1 to 8 is applicable to a pin photodiode, a power MOSFET, or a free wheel diode.

The above-described embodiments are merely exemplary, and it is needless to say that the configurations described in the embodiments can be partially substituted or combined. The same effects obtained by the same configuration of the embodiments are not repeatedly described in each of the embodiments. Further, the present invention is not limited to the above-described embodiments. For example, it is obvious to those skilled in the art that various modifications, improvements, combinations, and the like can be made.

It should be understood that the invention is not limited to the above-described embodiment, but may be modified into various forms on the basis of the spirit of the invention. Additionally, the modifications are included in the scope of the invention.

What is claimed is:

1. A laser annealing method comprising:
preparing an annealing object in which an absorbing film formed of a metal is formed on a surface of a wafer formed of silicon carbide into which an unactivated dopant is implanted; and
activating the dopant by causing a laser beam to be incident into the absorbing film,
wherein a power density of the laser beam in a surface of the annealing object is a value with which a silicide reaction is caused to occur between the absorbing film and the wafer and a metal silicide film formed by the silicide reaction is evaporated.

2. The laser annealing method according to claim 1, wherein the power density of the laser beam is a value with which crystallinity deteriorated by implantation of the dopant is recovered.

3. The laser annealing method according to claim 1, wherein the power density of the laser beam in the surface of the annealing object is 26 kW/cm$^2$ or higher.

4. The laser annealing method according to claim 2, wherein an irradiation time of the laser beam on the same region of the annealing object is 1 second or longer.

5. The laser annealing method according to claim 1, wherein a melting point of the absorbing film is higher than a melting point of single-crystal silicon.

6. The laser annealing method according to claim 5, wherein the absorbing film is formed of at least one metal selected from the group consisting of tungsten, molybdenum, titanium, and niobium.

7. The laser annealing method according to claim 1, wherein the dopant is an element that imparts p-type conductivity to silicon carbide by being activated.

8. A laser annealing device comprising:
a holding mechanism that holds an annealing object in which an absorbing film is formed on a surface of a wafer formed of silicon carbide into which an unactivated dopant is implanted;
a laser source that causes a laser beam to be incident into the annealing object held by the holding mechanism; and
a control device that controls the laser source such that a power density of the laser beam in a surface of the annealing object is a value with which a silicide reaction is caused to occur between the absorbing film and the wafer and a metal silicide film formed by the silicide reaction is evaporated.

9. The laser annealing device according to claim 8, further comprising:
a chamber that accommodates the annealing object held by the holding mechanism; and
a gas introduction port through which inert gas is introduced into the chamber.

10. The laser annealing device according to claim 8, wherein the holding mechanism has a structure that inhibits heat transfer from the annealing object to the outside of the holding mechanism.

* * * * *